United States Patent
He et al.

(10) Patent No.: US 11,264,477 B2
(45) Date of Patent: Mar. 1, 2022

(54) FIELD-EFFECT TRANSISTORS WITH INDEPENDENTLY-TUNED THRESHOLD VOLTAGES

(71) Applicant: GLOBALFOUNDRIES U.S. Inc., Santa Clara, CA (US)

(72) Inventors: Xiaoli He, Mechanicville, NY (US); Bingwu Liu, Clifton Park, NY (US); Tao Chu, Portland, OR (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 66 days.

(21) Appl. No.: 16/579,050

(22) Filed: Sep. 23, 2019

(65) Prior Publication Data

US 2021/0091202 A1 Mar. 25, 2021

(51) Int. Cl.
*H01L 29/51* (2006.01)
*H01L 27/092* (2006.01)
(Continued)

(52) U.S. Cl.
CPC ...... *H01L 29/513* (2013.01); *H01L 21/28185* (2013.01); *H01L 21/823857* (2013.01); *H01L 27/092* (2013.01)

(58) Field of Classification Search
CPC ........... H01L 29/513; H01L 21/823857; H01L 27/092; H01L 27/0886; H01L 21/823842;
(Continued)

(56) References Cited

U.S. PATENT DOCUMENTS 8,524,554 B2   9/2013 Cho et al.
8,659,084 B1 * 2/2014 Chang ............ H01L 21/823842
                                                    257/347
(Continued)

FOREIGN PATENT DOCUMENTS

JP          2011103329 A      5/2011

OTHER PUBLICATIONS

A. Veloso et al., "Flexible and robust capping-metal gate integration technology enabling multiple-VT CMOS in MuGFETs," 2008 Symposium on VLSI Technology, Honolulu, HI, 2008, pp. 14-15.
(Continued)

*Primary Examiner* — Didarul A Mazumder
(74) *Attorney, Agent, or Firm* — Thompson Hine LLP; Anthony Canale (57) ABSTRACT

Structures for field-effect transistors and methods of forming a structure for field-effect transistors. A semiconductor layer includes first and second channel regions, a first field-effect transistor has a first gate dielectric layer over the first channel region, and a second field-effect transistor has a second gate dielectric layer over the second channel region. The first and second channel regions are each composed of an undoped section of an intrinsic semiconductor material, the first gate dielectric layer contains a first atomic concentration of a work function metal, and the second gate dielectric layer contains a second atomic concentration of the work function metal that is greater than the first atomic concentration of the work function metal in the first gate dielectric layer.

8 Claims, 5 Drawing Sheets

(51) Int. Cl.
    *H01L 21/8238*    (2006.01)
    *H01L 21/28*      (2006.01)

(58) Field of Classification Search
    CPC ........... H01L 29/66545; H01L 27/0629; H01L 27/0924
    USPC .......................................... 257/369; 438/199
    See application file for complete search history.

(56) References Cited

U.S. PATENT DOCUMENTS

| | | | |
|---|---|---|---|
| 8,673,731 B2 | 3/2014 | Chang et al. | |
| 2008/0242068 A1* | 10/2008 | Kurahashi | H01L 21/823842 438/542 |
| 2010/0171180 A1* | 7/2010 | Zhang | H01L 29/4958 257/369 |
| 2010/0327366 A1* | 12/2010 | Manabe | H01L 21/823842 257/369 |
| 2010/0327373 A1* | 12/2010 | Carter | H01L 29/6659 257/392 |
| 2012/0153401 A1* | 6/2012 | Javorka | H01L 21/823807 257/392 |
| 2013/0214356 A1 | 8/2013 | Cheng et al. | |
| 2014/0312423 A1 | 10/2014 | Cheng et al. | |
| 2015/0187763 A1* | 7/2015 | Kim | H01L 27/0924 257/392 |
| 2016/0190018 A1* | 6/2016 | Chen | H01L 27/0629 257/369 |
| 2016/0190019 A1 | 6/2016 | Yang et al. | |
| 2018/0033867 A1 | 2/2018 | Seong et al. | |
| 2019/0067011 A1* | 2/2019 | Wang | H01L 27/0924 |
| 2020/0119150 A1* | 4/2020 | Lee | H01L 29/66545 |
| 2020/0350414 A1* | 11/2020 | Lee | H01L 27/0886 |

OTHER PUBLICATIONS

Taiwan Intellectual Property office, Examination Report received in Taiwanese Patent Application No. 109128612 dated Mar. 15, 2021.
Taiwan Intellectual Property office, Examination Report received in Taiwanese Patent Application No. 109128612 dated Aug. 9, 2021.

* cited by examiner

FIELD-EFFECT TRANSISTORS WITH INDEPENDENTLY-TUNED THRESHOLD VOLTAGES

BACKGROUND

The present invention relates to semiconductor device fabrication and integrated circuits and, more specifically, to structures for field-effect transistors and methods of forming a structure for field-effect transistors.

Complementary-metal-oxide-semiconductor (CMOS) processes may be employed to build a combination of p-type and n-type field-effect transistors that are used as devices to construct, for example, logic cells. Field-effect transistors generally include a source, a drain, a body supplying a channel region between the source and drain, and a gate electrode overlapped with the channel region. When a control voltage exceeding a characteristic threshold voltage is applied to the gate electrode, carrier flow occurs in the channel region between the source and drain to produce a device output current.

Field-effect transistors of each conductivity type may be formed with multiple different threshold voltages on the same chip. The adjustments to the threshold voltages of the field-effect transistors may include adjustments to the work function metal used to construct the gate electrode, and adjustments to the doping of the channel region. The channel regions of p-type field-effect transistors may include n-type doping, and the channel regions of n-type field-effect transistors may include p-type doping as part of a threshold voltage setting scheme. However, adjusting the threshold voltage with channel doping may degrade channel mobility and degrade performance. In addition, a change to one of the work function metals may impact the threshold voltages of the field-effect transistors of both conductivity types, which reduces the freedom to tune the threshold voltages and increases the complexity of the circuit design. In addition, the separations that can be achieved between adjacent threshold voltages may be less than optimum to provide the different threshold voltages.

Improved structures for field-effect transistors and methods of forming a structure for field-effect transistors are needed.

SUMMARY

In an embodiment of the invention, a structure includes a semiconductor layer having a first channel region and a second channel region, a first field-effect transistor having a first gate dielectric layer over the first channel region, and a second field-effect transistor having a second gate dielectric layer over the second channel region. The first channel region and the second channel region are each composed of an undoped section of an intrinsic semiconductor material, the first gate dielectric layer contains a first atomic concentration of a work function metal, and the second gate dielectric layer contains a second atomic concentration of the work function metal that is greater than the first atomic concentration of the work function metal in the first gate dielectric layer.

In an embodiment of the invention, a structure includes a semiconductor layer having a first channel region and a second channel region, a first field-effect transistor having a first gate dielectric layer over the first channel region, and a second field-effect transistor having a second gate dielectric layer over the second channel region. The first channel region and the second channel region are each composed of an undoped section of an intrinsic semiconductor material, the first gate dielectric layer containing an atomic concentration of a first work function metal, and the second gate dielectric layer contains an atomic concentration of a second work function metal that is different in composition than the first work function metal.

In an embodiment of the invention, a method includes depositing a gate dielectric layer over a first channel region and a second channel region in a semiconductor layer, depositing a first layer of a work function metal on the gate dielectric layer over the first channel region and the second channel region, and removing the first layer of the work function metal from the gate dielectric layer over the first channel region of the semiconductor layer. After the first layer of the work function metal is removed from the gate dielectric layer over the first channel region of the semiconductor layer, a second layer of the work function metal is deposited on the gate dielectric layer over the first channel region and on the first layer of the work function metal over the second channel region. The method further includes diffusing atoms of the work function metal with an annealing process from the first layer of the work function metal into the gate dielectric layer over the first channel region and from the first layer and the second layer of the work function metal into the gate dielectric layer over the second channel region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
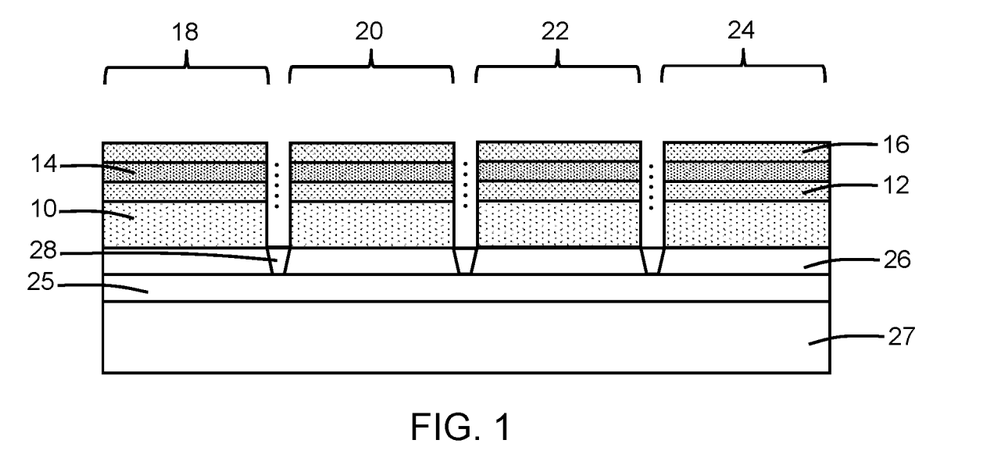
FIGS. 1-10 are cross-sectional views of a structure for a field-effect transistor at successive stages of a fabrication method in accordance with embodiments of the invention.

With reference to FIG. 1 and in accordance with embodiments of the invention, layers 10, 12, 14, 16 of a heterogeneous multi-layer stack are formed over different regions 18, 20, 22, 24 of a semiconductor layer 26. In an embodiment, the semiconductor layer 26 may be the device layer of a semiconductor-on-insulator (SOI) wafer that further includes a buried insulator layer 25 and a substrate 27. The semiconductor layer 26 is separated from the substrate 27 by the intervening buried insulator layer 25, and the semiconductor layer 26 may be considerably thinner than the substrate 27. The regions 18, 20, 22, 24 may be electrically isolated by isolation regions 28 composed of dielectric material, such as silicon dioxide, that extend through the semiconductor layer 26 to the buried insulator layer 25.

The semiconductor layer 26 and the substrate 27 may be composed of a single-crystal semiconductor material, such as single-crystal silicon, and the buried insulator layer 25 may be constituted by a buried oxide (BOX) layer. The semiconductor layer 26 may be composed of intrinsic semiconductor material (e.g., intrinsic silicon) that is undoped and that does not exhibit either n-type conductivity or p-type conductivity. In an embodiment, the semiconductor layer 26 may have a thickness that ranges from about 3 nanometers (nm) to about 200 nm. In an embodiment, the SOI wafer may be an extremely thin semiconductor-on-insulator (ETSOI) wafer with a thin semiconductor layer 26 and a thin buried insulator layer 25, and the ETSOI wafer may be used to fabricate fully-depleted SOI (FDSOI) devices. In an embodiment, the semiconductor layer 26 of the ETSOI wafer may have a thickness in an ultra-thin regime (i.e., about 3 nm to about 10 nm) suitable to manufacture FDSOI devices.

The layer 10 may be composed of a dielectric material, such as a high-k dielectric material like hafnium oxide, that is suitable for use as a gate dielectric in a transistor. The thickness of the layer 10 may range from two (2) nanometers (nm) to four (4) nm. The layers 12, 14, 16 may be composed of metals. For example, the layers 12, 16 may be composed of the same metal, such as titanium nitride, and the layer 14 may be composed of a different metal than the layers 12, 16. In an embodiment, the layer 14 may contain a p-type work function metal. In an embodiment, the p-type work function metal contained in the layer 14 may be aluminum. In embodiments, the thickness of the layer 14 may be in a range of 0.1 angstroms (Å) to 5.0 Å. The layers 10, 12, 14, 16 are sequentially deposited by, for example, atomic layer deposition over the semiconductor layer 26 with the layer 10 positioned on the semiconductor layer 26 between the layers 12, 14, 16 and the semiconductor layer 26, and the layer 14 positioned between the layer 12 and the layer 16 in a vertical direction.

Figure 2:
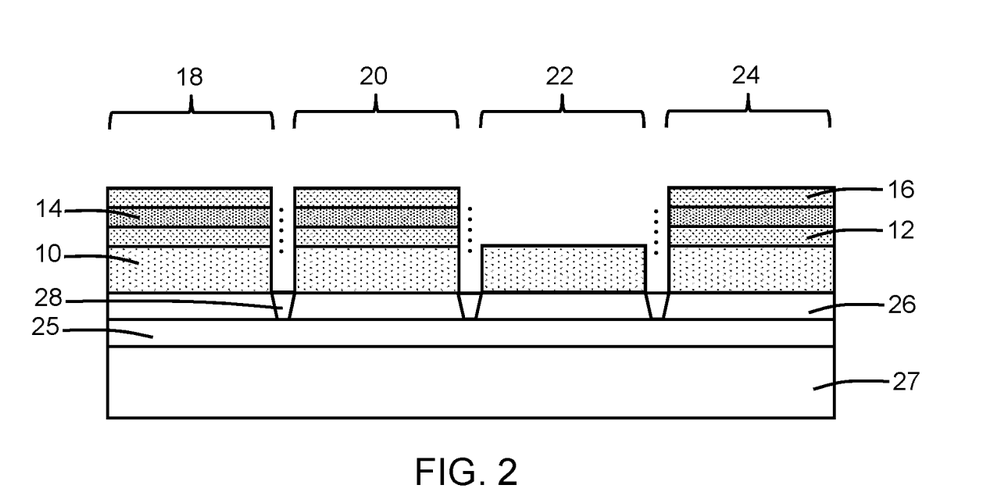

With reference to FIG. 2 in which like reference numerals refer to like features in FIG. 1 and at a subsequent fabrication stage, the layers 12, 14, 16 are removed from the region 22 of the semiconductor layer 26 using lithography and etching processes. To that end, an etch mask may be formed by lithography that covers the regions 18, 20, 24 and that is open over the region 22. The etch mask may include a layer of, for example, an organic photoresist that is applied by a spin coating process, pre-baked, exposed to light projected through a photomask, baked after exposure, and developed with a chemical developer. After forming the etch mask, the layer 16 is patterned with one or more etching processes to define a hardmask covering the layers 12, 14 in the regions 18, 20, 22 and open over the layers 12, 14 in the region 22. The etch mask may be stripped following the one or more etching processes. After forming the hardmask, the layers 12, 14 are removed from the region 22 by one or more etching processes, which exposes the layer 10 in the region 22.

Figure 3:
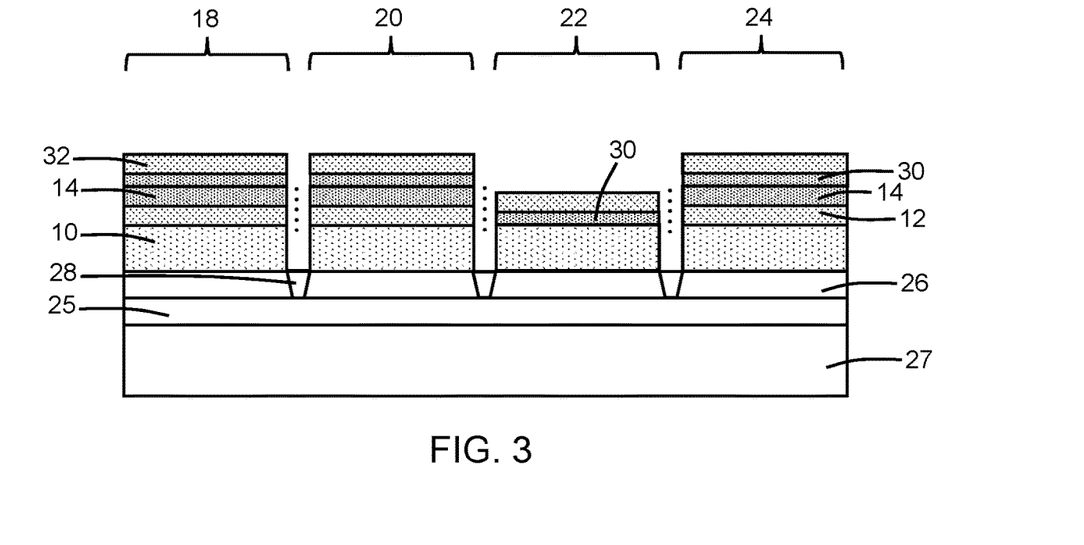

With reference to FIG. 3 in which like reference numerals refer to like features in FIG. 2 and at a subsequent fabrication stage, the layer 16 is removed from the regions 18, 20, 24, with an etching process, followed by the formation of layers 30, 32 over all regions 18, 20, 22, 24. The layers 30, 32 may be composed of metals. For example, the layer 32 may be composed of titanium nitride, and the layer 30 may be composed of a different metal than the layer 32. In an embodiment, the layer 30 may contain a p-type work function metal. In an embodiment, the p-type work function metal contained in the layer 30 may be aluminum. The layer 30 may be composed of the same p-type work function metal (e.g., aluminum) as the layer 14. In embodiments, the thickness of the layer 30 may be in a range of 0.1 Å to 5.0 Å. In an embodiment, the thickness of the layer 30 may be less than the thickness of the layer 14. In an embodiment, the thickness of the layer 30 may be greater than the thickness of the layer 14. In an embodiment, the thickness of the layer 30 may be equal to the thickness of the layer 14. The layers 30, 32 are sequentially deposited by, for example, atomic layer deposition over the semiconductor layer 26 with the layer 32 formed over the layer 30. The layer 30 is located directly on the layer 10 in the region 22, and the layer 30 is located directly on the layer 14 in the regions 18, 20, 24.

Figure 4:
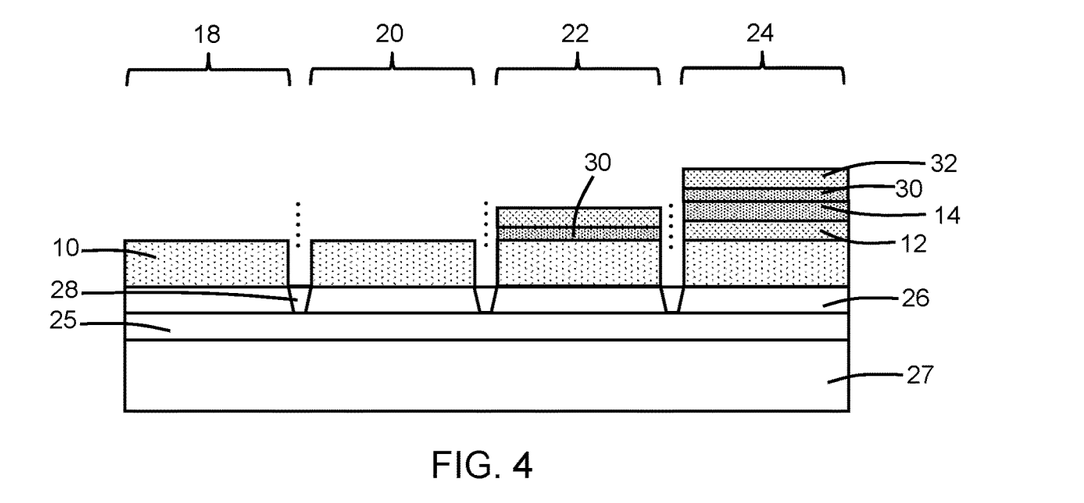

With reference to FIG. 4 in which like reference numerals refer to like features in FIG. 3 and at a subsequent fabrication stage, the layers 12, 14, 30, 32 are removed from the regions 18, 20 of the semiconductor layer 26 using lithography and etching processes. To that end, an etch mask may be formed by lithography that covers the regions 22, 24 and that is open over the regions 18, 20. The etch mask may include a layer of, for example, an organic photoresist that is applied by a spin coating process, pre-baked, exposed to light projected through a photomask, baked after exposure, and developed with a chemical developer. After forming the etch mask, the layer 32 is patterned with one or more etching processes to define a hardmask covering the layers 30, 32 in the region 22 and the layers 12, 14, 30, 32 in the region 24, and open over the layers 12, 14, 30, 32 in the regions 18, 20. The etch mask may be stripped following the one or more etching processes. After forming the hardmask, the layers 12, 14, 30, 32 are removed from the regions 18, 20 by one or more etching processes, which exposes the layer 10 in regions 18, 20.

Figure 5:
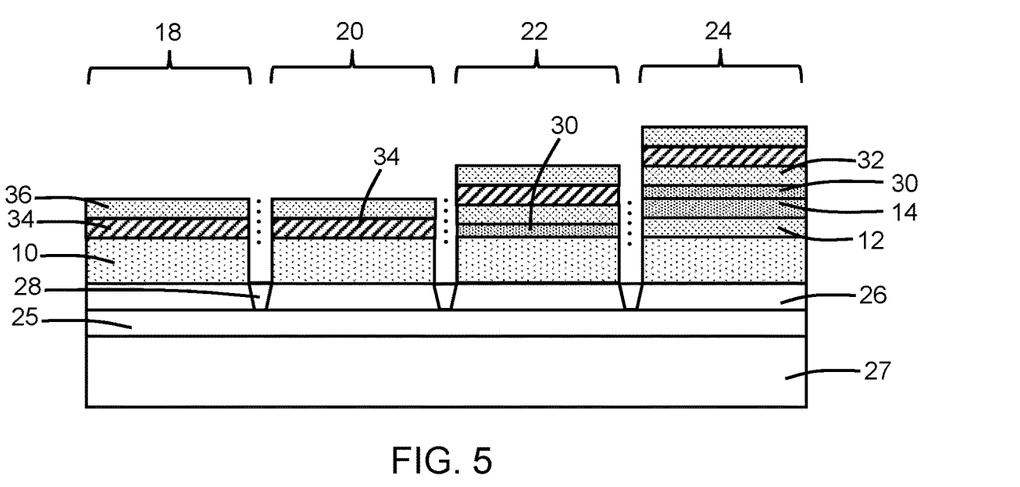

With reference to FIG. 5 in which like reference numerals refer to like features in FIG. 4 and at a subsequent fabrication stage, layers 34, 36 are formed over all regions 18, 20, 22, 24. The layers 34, 36 may be composed of metals. For example, the layer 36 may be composed of titanium nitride, and the layer 34 may be composed of a different metal than the layer 36. In an embodiment, the layer 36 may contain an n-type work function metal. In an embodiment, the n-type work function metal contained in the layer 34 may be lanthanum. In embodiments, the thickness of the layer 34 may be in a range of 0.1 Å to 5.0 Å. The layers 34, 36 are sequentially deposited by, for example, atomic layer deposition over the semiconductor layer 26 with the layer 36 formed over the layer 34. The layer 34 is located directly on the layer 10 in the regions 18, 20, and the layer 34 is located directly on the layer 32 in the regions 22, 24.

Figure 6:
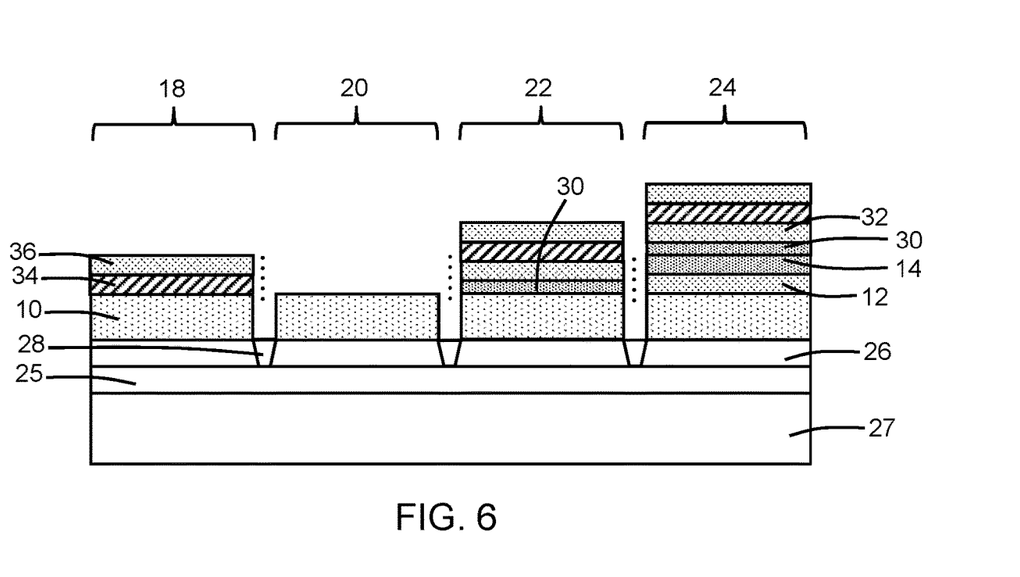

With reference to FIG. 6 in which like reference numerals refer to like features in FIG. 5 and at a subsequent fabrication stage, the layers 34, 36 are removed from the region 20 of the semiconductor layer 26 using lithography and etching processes. To that end, an etch mask may be formed by lithography that covers the regions 18, 22, 24 and that is open over the region 20. The etch mask may include a layer of, for example, an organic photoresist that is applied by a spin coating process, pre-baked, exposed to light projected through a photomask, baked after exposure, and developed with a chemical developer. After forming the etch mask, the layer 36 is patterned with one or more etching processes to define a hardmask covering the layer 34 in region 18, the layers 30, 32, 34 in the region 22, and the layers 12, 14, 30, 32, 34 in the region 24, and open over the layer 34 in the region 20. The etch mask may be stripped following the one or more etching processes. After forming the hardmask, the layer 34 is removed from the region 20 by one or more etching processes, which exposes the layer 10 in region 20.

Figure 7:
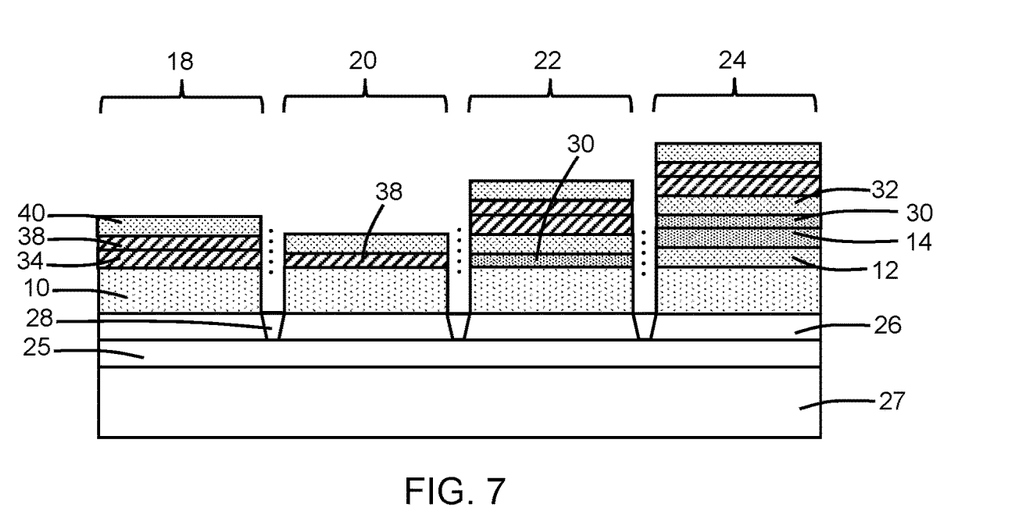

With reference to FIG. 7 in which like reference numerals refer to like features in FIG. 6 and at a subsequent fabrication stage, the layer 36 is removed from the regions 18, 22, 24, with an etching process, followed by the formation of layers 38, 40 over all regions 18, 20, 22, 24. The layers 38, 40 may be composed of metals. For example, the layer 40 may be composed of titanium nitride, and the layer 38 may be composed of a different metal than the layer 40. In an embodiment, the layer 38 may contain an n-type work function metal. In an embodiment, the n-type work function metal contained in the layer 38 may be lanthanum. The layer 38 may be composed of the same n-type work function metal (e.g., lanthanum) as the layer 34. In embodiments, the thickness of the layer 38 may be in a range of 0.1 Å to 5.0 Å. In an embodiment, the thickness of the layer 38 may be less than the thickness of the layer 34. In an embodiment, the thickness of the layer 38 may be greater than the thickness of the layer 34. In an embodiment, the thickness of the layer 38 may be equal to the thickness of the layer 34. The layers 38, 40 are sequentially deposited by, for example, atomic layer deposition over the semiconductor layer 26 with the layer 40 formed over the layer 38. The layer 38 is located directly on the layer 10 in the region 20, the layer 38 is located directly on the layer 34 in the region 18, and the layer 38 is located directly on the layer 34 in regions 22, 24.

Figure 8:
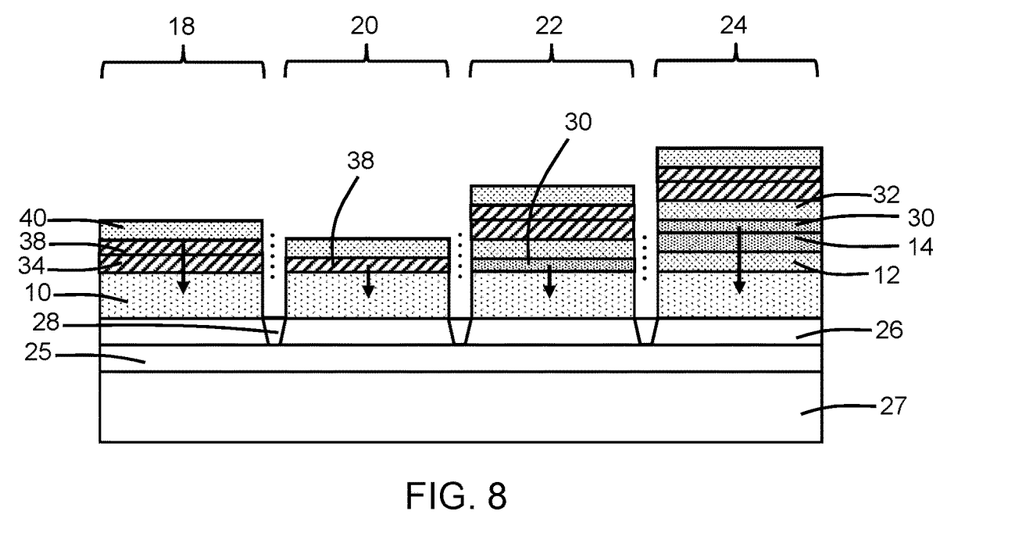

With reference to FIG. 8 in which like reference numerals refer to like features in FIG. 7 and at a subsequent fabrication stage, an annealing process is performed to drive atoms of the material (e.g., lanthanum) of layers 34, 38 into the portion of the layer 10 in the region 18, atoms of the material (e.g., lanthanum) of layer 34 into the portion of the layer 10 in the region 20, atoms of the material (e.g., aluminum) of layer 30 into the portion of the layer 10 in the region 22, and atoms of the (e.g., aluminum) material of layers 14, 30 into the portion of the layer 10 in the region 24. The annealing process may be a rapid thermal annealing process performed with given annealing conditions, and the layer 40 functions as a cap layer. In embodiments, the rapid thermal annealing process may be performed at a substrate temperature of 900° C. to 1100° C. for a duration of one (1) second to ten (10) seconds.

The composition of the layer 10 is locally doped in the regions 18, 20 by the transferred dopant atoms. The portion of the layer 10 in the region 18 is doped with dopant atoms transferred from the layers 34, 38 by diffusion, and the portion of the layer 10 in the region 20 is doped with dopant atoms transferred from the layer 34 by diffusion. The atomic concentration of dopant atoms in portion of the layer 10 in region 18 is greater than the atomic concentration of dopant atoms in the portion of the layer 10 in region 20 because the total thickness of the layers 34, 38 is greater than the thickness of the layer 38 alone. In embodiments, the atomic concentrations of lanthanum dopant atoms in hafnium oxide may each range from about 0.1 atomic percent (at. %) to about 7.5 at. % subject to the portion of the layer 10 in region 18 having a higher atomic concentration than the portion of the layer 10 in region 20. The range of atomic concentrations will vary dependent on the composition of the layers 34, 38 and the composition of the layer 10. In an alternative embodiment, the deposition of the layer 34 may be omitted from the process flow such that the atomic concentration of dopant atoms in the layer in region 20 is zero.

The composition of the layer 10 is locally doped in the regions 22, 24 by the transferred dopant atoms. The portion of the layer 10 in the region 22 is doped with dopant atoms transferred from the layers 14, 30 by diffusion, and the portion of the layer 10 in the region 24 is doped with dopant atoms transferred from the layer 30 by diffusion. The atomic concentration of dopant atoms in the portion of the layer 10 in region 24 is greater than the atomic concentration of dopant atoms in the portion of the layer 10 in region 22 because the total thickness of the layers 14, 30 is greater than the thickness of the layer 30 alone. In embodiments, the atomic concentrations of aluminum dopant atoms in hafnium oxide may each range from about 0.2 atomic percent (at. %) to about 15.5 at. % subject to the portion of the layer 10 in region 24 having a higher atomic concentration than the portion of the layer 10 in region 22. The range of atomic concentrations will vary dependent on the composition of the layers 14, 30 and the composition of the layer 10. In an alternative embodiment, the deposition of the layer 14 may be omitted from the process flow such that the atomic concentration of dopant atoms in the layer in region 22 is zero. The layer 32 blocks the diffusion of dopant atoms from the layers 34, 38 to the layer 10 in the regions 22, 24

By way of example and with reference to the Table, the layer 10 may be composed of hafnium oxide ($HfO_2$) having a layer thickness of 2 nanometers (nm), the n-type work function metal may be lanthanum (La), the p-type work function metal may be aluminum (Al), and atomic concentration may be expressed as atomic percent (at. %). The atomic percent of lanthanum resulting from different layer thicknesses in angstroms (Å) diffused into a 2 nm thick layer of hafnium oxide is shown in the Table. The atomic percent of aluminum resulting from different layer thicknesses in angstroms (Å) diffused into a 2 nm thick layer of hafnium oxide is shown in the Table. As a specific example, the portion of the layer 10 in region 22 may have an atomic concentration of 1.79 at. % resulting from being doped with aluminum from layer 30 having a thickness of 0.5 Å, and the portion of the layer 10 in region 24 may have an atomic concentration of 6.76 at. % resulting from being doped with aluminum from layers 14, 30 having a total thickness of 2.0 Å.

TABLE

| $HfO_2$ (nm) | La (Å) | Al (Å) | La (at. %) | Al (at. %) |
|---|---|---|---|---|
| 2 | 0.1 | 0.1 | 0.16 | 0.36 |
| 2 | 0.2 | 0.2 | 0.32 | 0.72 |
| 2 | 0.5 | 0.5 | 0.79 | 1.79 |
| 2 | 1 | 1 | 1.58 | 3.50 |
| 2 | 2 | 2 | 3.09 | 6.76 |
| 2 | 3 | 3 | 4.57 | 9.80 |
| 2 | 4 | 4 | 6.00 | 12.62 |
| 2 | 5 | 5 | 7.39 | 15.38 |

Figure 9:
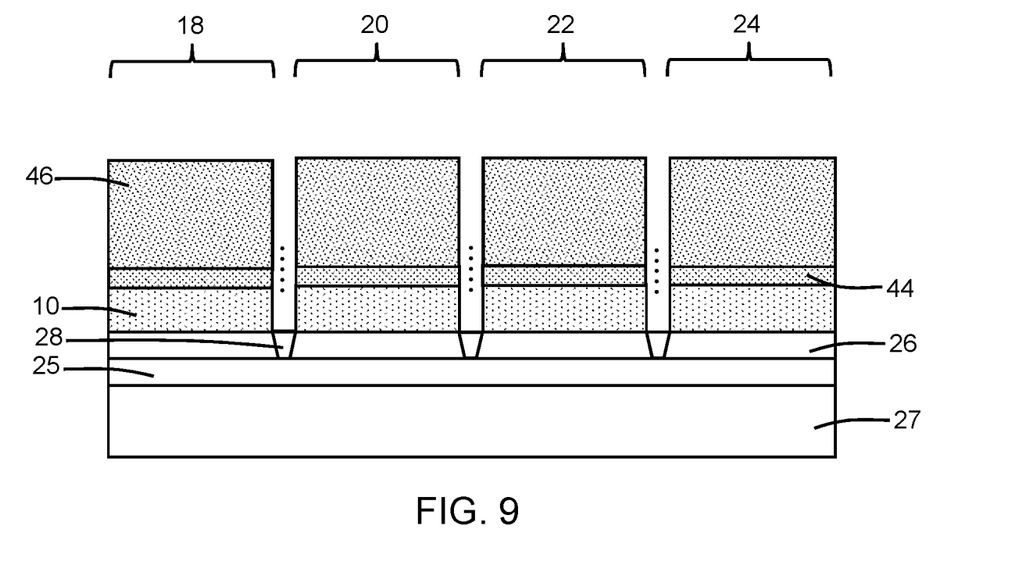

With reference to FIG. 9 in which like reference numerals refer to like features in FIG. 8 and at a subsequent fabrication stage, the cap layers 12, 32, 40 are removed from the layer 10 following the annealing process. A barrier layer 44 and a layer 46 are formed over the layer 10. The barrier layer 44 may be composed of a metal, such as titanium nitride, and the layer 46 may be composed of, for example, amorphous silicon or tungsten. The layer removal and deposition of layers 44, 46 restore the planarity of the different regions 18, 20, 22, 24. The barrier layer 44 may have an equal thickness over each of the regions 18, 20, 22, 24.

Figure 10:
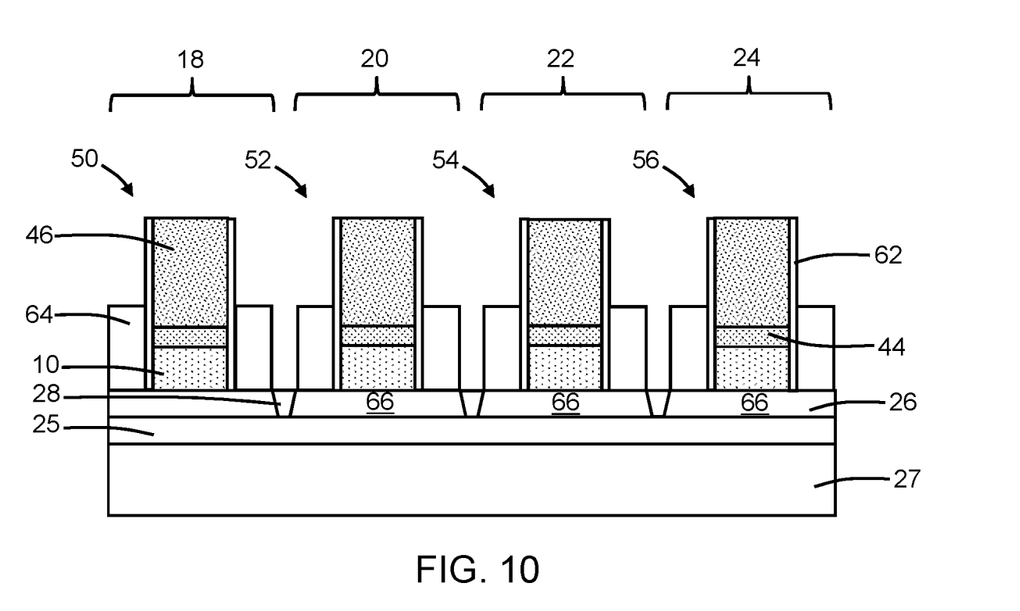

With reference to FIG. 10 in which like reference numerals refer to like features in FIG. 9 and at a subsequent fabrication stage, field-effect transistors 50, 52, 54, 56 are formed in the different regions 18, 20, 22, 24 of the semiconductor layer 26. The layers 10, 44, 46 may be patterned to provide stacked sections in each of the regions 18, 20, 22, 24. The sections of the layer 10, the sections of the barrier layer 44, and the sections of the layer 46 may each have equal thicknesses in the regions 18, 20, 22, 24. The substrate 27 may include one or more wells (not shown) that can be biased to provide the field-effect transistors 50, 52, 54, 56 with respective back gates. The layer 46 may provide a final conductor layer in each of the field-effect transistors 50, 52, 54, 56. In an alternative embodiment, the sections of the layer 46 may be removed and replaced as part of a replacement metal gate process.

Sidewall spacers 62 are positioned adjacent to the side surfaces or sidewalls of the stacked sections of the layers 10, 44, 46. The sidewall spacers 62 may be formed by depositing a conformal layer composed of a dielectric material, such as silicon nitride, over the sections of the cap layer 46 and etching the deposited conformal layer with an anisotropic etching process, such as reactive ion etching.

Source/drain regions 64 are positioned adjacent to the opposite spacer-clad sidewalls of the stacked sections of the layers 10, 44, 46. As used herein, the term "source/drain region" means a doped region of semiconductor material that can function as either a source or a drain of a field-effect transistor. The source/drain regions 64 may be provided by sections of an epitaxially-grown semiconductor layer that are in situ doped during epitaxial growth. In an embodiment, the source/drain regions 64 may be in situ doped during epitaxial growth with a p-type dopant (e.g., boron) that provides p-type conductivity, and the source/drain regions 64 may be composed of silicon-germanium. In an alternative embodiment, the source/drain regions 64 may be in situ doped during epitaxial growth with an n-type dopant (e.g., phosphorus and/or arsenic) that provides n-type conductivity, and the source/drain regions 64 may be composed of silicon.

In an embodiment, the field-effect transistors 50, 52, 54, 56 may all be p-type transistors with p-type source/drain regions 64. In an embodiment, the field-effect transistors 50, 52, 54, 56 may all be n-type transistors with n-type source/drain regions 64. In an embodiment, the field-effect transistors 50, 52, 54, 56 may all be p-type planar transistors with p-type source/drain regions 64. In an embodiment, the field-effect transistors 50, 52, 54, 56 may all be n-type planar transistors with n-type source/drain regions 64. The threshold voltages of the field-effect transistors 50, 52, 54, 56 may all be different and may be separated by increments that provide a progression of threshold voltages to provide, for example, super-low-voltage, low-voltage, regular-voltage, and high-voltage transistors of either conductivity type as flavors available to form one or more integrated circuits on a chip. The tuning of the threshold voltages can be achieved without the need to deposit n-type and p-type work function metal layers over the barrier layer 44.

A channel region 66 is present in the semiconductor layer 26 beneath each of the different stacked sections of the layers 10, 44, 46. The channel regions 66 represent respective undoped sections of an intrinsic semiconductor material that originates from the semiconductor layer 26. The channel regions 66 can be undoped and free of dopant because channel doping is not needed to adjust the threshold voltages of the field-effect transistors 50, 52, 54, 56 due to the dopants added to the layer 10 in the different regions 18, 20, 22, 24. The elimination of channel doping may improve channel mobility and thereby enhance transistor performance, and the elimination of channel doping may also improve reliability.

In addition, the threshold voltages of the field-effect transistors 50, 52, 54, 56 can be individually adjusted and tuned through the doping of the layer 10 in the different regions 18, 20, 22, 24. The threshold voltages of the field-effect transistors 50, 52, 54, 56 of either conductivity type can be tuned through the concentrations of dopant in the layer 10, which can be selected through selection of the thicknesses of the layers 14, 30 and the thicknesses of the layers 34, 38. The threshold voltages of the field-effect transistors 50, 52, 54, 56 may therefore be independently selected through the doping of the layer 10. The increased freedom to tune the threshold voltages via the doping of the layer 10 can provide the ability to tailor the separations (in millivolts) that can be achieved between the different threshold voltages in order to optimize the values of the different threshold voltages.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a semiconductor layer including a first channel region and a second channel region that are each comprised of an undoped section of an intrinsic semiconductor material;
    a first field-effect transistor including a first gate dielectric layer over the first channel region, the first gate dielectric layer comprising hafnium oxide and a first atomic concentration of a work function metal as diffused atoms in the hafnium oxide; and a second field-effect transistor including a second gate dielectric layer over the second channel region, the second gate dielectric layer comprising hafnium oxide and a second atomic concentration of the first work function metal as diffused atoms in the hafnium oxide, wherein the work function metal is aluminum, the first atomic concentration and the second atomic concentration are each in a range of about 0.2 atomic percent to about 15.5 atomic percent, and the second atomic concentration is greater than the first atomic concentration.

2. The structure of claim 1 wherein the first field-effect transistor has a first threshold voltage related to the first atomic concentration of the work function metal, the second field-effect transistor has a second threshold voltage related to the second atomic concentration of the work function metal, and the second threshold voltage differs from the first threshold voltage.

3. The structure of claim 1 further comprising:
a first barrier layer over the first gate dielectric layer; and
a second barrier layer over the second gate dielectric layer,
wherein the first barrier layer and the second barrier layer comprise titanium nitride.

4. The structure of claim 3 wherein the first barrier layer and the second barrier layer have equal thicknesses.

5. A structure comprising:
a semiconductor layer including a first channel region and a second channel region that are each comprised of an undoped section of an intrinsic semiconductor material;

a first field-effect transistor including a first gate dielectric layer over the first channel region, the first gate dielectric layer comprising hafnium oxide and a first atomic concentration of a work function metal as diffused atoms in the hafnium oxide; and a second field-effect transistor including a second gate dielectric layer over the second channel region, the second gate dielectric layer comprising hafnium oxide and a second atomic concentration of the work function metal as diffused atoms in the hafnium oxide, wherein the work function metal is lanthanum, the first atomic concentration and the second atomic concentration are each in a range of about 0.1 atomic percent to about 7.5 atomic percent, and the second atomic concentration is greater than the first atomic concentration.

6. The structure of claim 5 further comprising:
a first barrier layer over the first gate dielectric layer; and
a second barrier layer over the second gate dielectric layer,
wherein the first barrier layer and the second barrier layer comprise titanium nitride.

7. The structure of claim 5 wherein the first field-effect transistor has a first threshold voltage related to the first atomic concentration of the work function metal, the second field-effect transistor has a second threshold voltage related to the second atomic concentration of the work function metal, and the second threshold voltage differs from the first threshold voltage.

8. The structure of claim 6 wherein the first barrier layer and the second barrier layer have equal thicknesses.

\* \* \* \* \*

UNITED STATES PATENT AND TRADEMARK OFFICE
CERTIFICATE OF CORRECTION

PATENT NO. : 11,264,477 B2
APPLICATION NO. : 16/579050
DATED : March 1, 2022
INVENTOR(S) : Xiaoli He et al.

It is certified that error appears in the above-identified patent and that said Letters Patent is hereby corrected as shown below:

In the Claims

Claim 1, Column 9, Line 7 should read:
--and a second atomic concentration of the work--

Signed and Sealed this
Third Day of May, 2022

Katherine Kelly Vidal
*Director of the United States Patent and Trademark Office*